US012644185B2

(12) United States Patent
Banerjee et al.

(10) Patent No.: US 12,644,185 B2
(45) Date of Patent: Jun. 2, 2026

(54) LOW-TEMPERATURE/BEOL-COMPATIBLE HIGHLY SCALABLE GRAPHENE SYNTHESIS TOOL

(71) Applicant: Destination 2D Inc., Milpitas, CA (US)

(72) Inventors: Kaustav Banerjee, Goleta, CA (US);
Ravi Iyengar, Milpitas, CA (US);
Nalin Rupesinghe, Cambridge (GB);
Satish Sundar, San Jose, CA (US)

(73) Assignee: Destination 2D, Inc., San Jose, CA (US)

( * ) Notice: Subject to any disclaimer, the term of this patent is extended or adjusted under 35 U.S.C. 154(b) by 0 days.

(21) Appl. No.: 19/087,376

(22) Filed: Mar. 21, 2025

(65) Prior Publication Data

US 2025/0215570 A1     Jul. 3, 2025

Related U.S. Application Data

(63) Continuation of application No. 17/863,232, filed on Jul. 12, 2022, now Pat. No. 12,281,388, which is a
(Continued)

(51) Int. Cl.
| | |
|---|---|
| *C23C 16/46* | (2006.01) |
| *C23C 16/26* | (2006.01) |
| *H10P 95/90* | (2026.01) |

(52) U.S. Cl.
CPC .............. *C23C 16/46* (2013.01); *C23C 16/26* (2013.01); *H10P 95/90* (2026.01)

(58) Field of Classification Search
CPC ....... C23C 16/46; C23C 16/26; H01L 21/324; H10P 95/90
See application file for complete search history.

(56) References Cited

U.S. PATENT DOCUMENTS

| | | | |
|---|---|---|---|
| 6,329,304 B1 | 12/2001 | Kuznetsov et al. | |
| 6,488,778 B1 | 12/2002 | Ballantine et al. | |
(Continued)

FOREIGN PATENT DOCUMENTS

| | | | |
|---|---|---|---|
| WO | 2022140026 A2 | 6/2022 | |

OTHER PUBLICATIONS

Agashiwala et al., "Reliability and Performance of CMOS-Compatible Multi-Level Graphene Interconnects Incorporating Vias," 2020 IEEE International Electron Devices Meeting (IEDM), San Francisco, CA, USA, 2020, pp. 31.1.1-31.1.4, DOI: 10.1109/IEDM13553.2020.9371986.
(Continued)

*Primary Examiner* — Nathan T Leong
(74) *Attorney, Agent, or Firm* — Greer, Burns & Crain, Ltd.; Steven P. Fallon

(57) ABSTRACT

In one aspect, a highly scalable diffusion-couple apparatus includes a transfer chamber configured to load a wafer into a process chamber. The process chamber is configured to receive the wafer substrate from the transfer chamber. The process chamber comprises a chamber for growth of a diffusion material on the wafer. A heatable bottom disk includes a first heating mechanism. The heatable bottom disk is fixed and heatable to a specified temperature. The wafer is placed on the heatable bottom disk. A heatable top disk comprising a second heating mechanism. The heatable top disk is configured to move up and down along an x axis and an x prime axis to apply a mechanical pressure to the wafer on the heatable bottom disk. While the heatable top disk applies the mechanical pressure, a chamber pressure is maintained at a specified low value. The first heating mechanism and the second heating mechanism can be independently tuned to any value in the working range.

20 Claims, 6 Drawing Sheets

Related U.S. Application Data continuation-in-part of application No. 17/857,954, filed on Jul. 5, 2022, now Pat. No. 11,976,369.

(60) Provisional application No. 63/218,498, filed on Jul. 6, 2021.

(56) References Cited

U.S. PATENT DOCUMENTS

| | | | |
|---|---|---|---|
| 6,521,503 | B2 | 2/2003 | Jacobson et al. |
| 6,704,496 | B2 | 3/2004 | Jacobson et al. |
| 7,022,627 | B2 | 4/2006 | Grannenman et al. |
| 7,217,670 | B2 | 5/2007 | van Kesteren |
| 7,231,141 | B2 | 6/2007 | Jacobson et al. |
| 7,313,931 | B2 | 1/2008 | Matsuoka |
| 7,410,355 | B2 | 8/2008 | Grannenman et al. |
| 8,119,204 | B2 | 2/2012 | Ikeda et al. |
| 8,252,378 | B2 | 8/2012 | Ibe et al. |
| 8,313,603 | B2 | 11/2012 | Ikeda et al. |
| 8,470,400 | B2 * | 6/2013 | Colombo ............... B82Y 30/00 |
| | | | 427/249.1 |
| 8,734,914 | B2 | 5/2014 | Ikeda et al. |
| 8,920,562 | B2 | 12/2014 | Ikeda et al. |
| 8,927,415 | B2 * | 1/2015 | Niyogi ................ H10W 20/035 |
| | | | 438/627 |
| 9,129,811 | B2 | 9/2015 | Cho et al. |
| 11,976,369 | B2 | 5/2024 | Banerjee et al. |
| 2003/0209327 | A1 | 11/2003 | Kuznetsov et al. |
| 2004/0083621 | A1 | 5/2004 | Yoo |
| 2008/0233669 | A1 | 9/2008 | Hirakata et al. |
| 2009/0279227 | A1 | 11/2009 | Ha |
| 2013/0074763 | A1 | 3/2013 | Ikeda et al. |
| 2013/0178004 | A1 | 7/2013 | Hirakata et al. |
| 2015/0206748 | A1 | 7/2015 | Sumant et al. |
| 2019/0272992 | A1 | 9/2019 | Bower et al. |
| 2021/0403326 | A1 | 12/2021 | Nosker et al. |
| 2023/0008834 | A1 | 1/2023 | Banerjee et al. |
| 2023/0313358 | A1 | 10/2023 | Banerjee et al. |
| 2024/0295018 | A1 | 9/2024 | Banerjee et al. |

OTHER PUBLICATIONS

Jiang et al., "CMOS-Compatible Doped-Multilayer-Graphene Interconnects for Next-Generation VLSI," 2018 IEEE International Electron Devices Meeting (IEDM), San Francisco, CA, USA, 2018, pp. 34.5.1-34.5.4, DOI: 10.1109/IEDM.2018.8614535.

United States Patent and Trademark Office, Office Action (Election/Restriction) mailed on Apr. 28, 2023, from related U.S. Appl. No. 17/857,954, 10 pages.

United States Patent and Trademark Office, Non-final Office Action mailed on Sep. 18, 2023, from related U.S. Appl. No. 17/857,954, 12 pages.

United States Patent and Trademark Office, Notice of Allowance mailed on Jan. 8, 2024, from related U.S. Appl. No. 17/857,954, 13 pages.

Notice of Allowance for related TW Application No. 11150496, mailed on Mar. 4, 2025, 4 pages.

United States Patent and Trademark Office, Non-final Office Action mailed on Feb. 12, 2025, from related U.S. Appl. No. 18/208,232, 5 pages.

Extended European Search Report from related European Patent Application No. 22217112.6, mailed Sep. 1, 2023, 4 pages.

United States Patent and Trademark Office, Notice of Allowance mailed on Feb. 6, 2025, from related U.S. Appl. No. 17/863,232, 7 pages.

Extended European Search Report from the corresponding European Patent Application No. 25222870.5, dated Mar. 25, 2026.

* cited by examiner

Electrical Control
110

Transfer Chamber
102

Mechanical / Turbo Pump
108

1267

Slit valve
106

Process Chamber
104

100

Thermal Insulation 218

Heating Power Supply 202

Hydraulic Cylinder (for applying mechanical pressure) 204

Heated Top Disk (movable up or down along the X-X' direction) 206

Heated Bottom Disk (fixed) 208

Process Chamber 210

Heating Power Supply 212

Wafer Transfer Chamber 214

Mechanical + Turbo Pump 216

104

302

Figure 4:
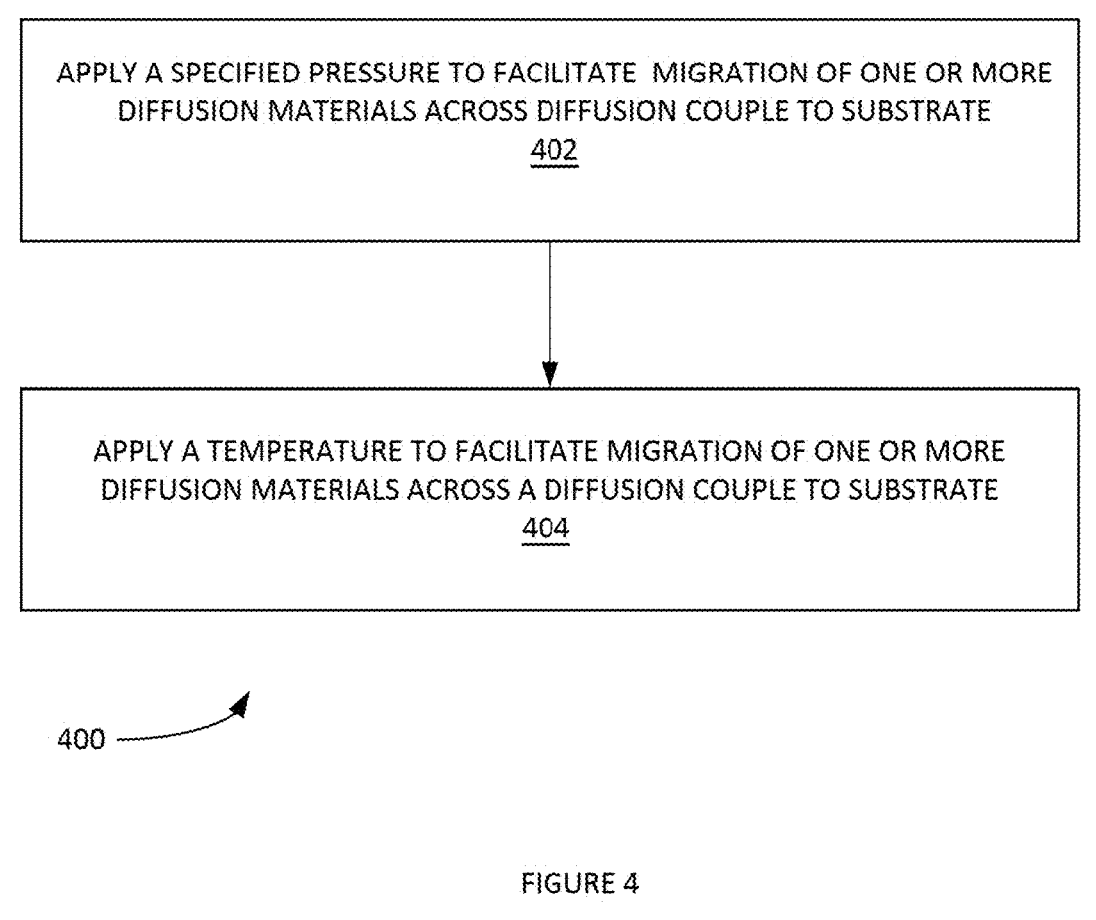

APPLY A SPECIFIED PRESSURE TO FACILITATE  MIGRATION OF ONE OR MORE DIFFUSION MATERIALS ACROSS DIFFUSION COUPLE TO SUBSTRATE
402

APPLY A TEMPERATURE TO FACILITATE MIGRATION OF ONE OR MORE DIFFUSION MATERIALS ACROSS A DIFFUSION COUPLE TO SUBSTRATE
404

DEPOSIT DIFFUSION COUPLE ON SUBSTRATE BY VARIOUS MEANS
502

PLACE PREPARED SUBSTRATE INTO AN ENVIRONMENT OF HIGH PRESSURE AND HIGH TEMPERATURE, RANGES OF WHICH ARE SPECIFIED IN THIS DOCUMENT, FOR A PERIOD OF TIME
504

APPLY HEAT
506

APPLY PRESSURE
508

500

PROVIDE THAT APPLICATION SURFACES OF TOP AND BOTTOM HEATER ARE PARALLEL TO SUBSTRATE, AND SUFFICIENTLY COMPLIANT SO AS TO NOT DAMAGE SUBSTRATE
602

PROVIDE SUFFICIENT CLEARANCE, PLAY AND COMPLIANCE TO TOP HEATER MECHANISM & PROVIDE A LAYER OF COMPLIANCE IF NEEDED TO APPLICATION SURFACES
604

PROVIDE REACTOR WITH MEANS TO PUT SUBSTRATE UNDER VACUUM AND EXPOSE IT TO OTHER GASES
606

INTERFACE REACTOR TO EQUIPMENT THAT DELIVERS SUBSTRATES TO AND FROM THE REACTOR
608

PROVIDE IN SITU SENSORS TO ENSURE THAT PRESSURE AND TEMPERATURE DISTRIBUTIONS RESULT IN OPTIMAL MIGRATION OF DEPOSITION MATERIAL
610

PROVIDE SOFTWARE CONTROLS TO ENSURE APPROPRIATE APPLICATION OF PROCESS PARAMETERS IN CORRECT SEQUENCE AND DURATION
612

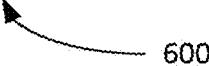
600

FIGURE 6

LOW-TEMPERATURE/BEOL-COMPATIBLE HIGHLY SCALABLE GRAPHENE SYNTHESIS TOOL

CLAIM OF PRIORITY

This application claims priority to and is a continuation of U.S. patent application Ser. No. 17/863,232, filed on 12 Jul. 2022, which is a continuation-in-part of U.S. patent application Ser. No. 17/857,954, filed on 5 Jul. 2021, and titled LOW-TEMPERATURE/BEOL-COMPATIBLE HIGHLY SCALABLE GRAPHENE SYNTHESIS TOOL. These patent applications are hereby incorporated by reference in their entirety.

U.S. patent application Ser. No. 17/857,954 claims priority to U.S. Provisional Patent Application No. 63/218,498, filed on 6 Jul. 2021, and titled WAFER-SCALE CMOS-COMPATIBLE GRAPHENE SYNTHESIS TOOL. This provisional application is hereby incorporated by reference in its entirety.

BACKGROUND

Solid-phase diffusion of atoms in a "material stack" forming a "diffusion-couple" can be leveraged to synthesize high-quality thin-films at relatively low temperatures, needed in a wide range of applications covering microelectronics, optoelectronics, bioelectronics, quantum computing, and many more. However, enabling such solid-phase diffusion assisted thin-film growth; particularly over large "wafer-scale" (e.g. 200 mm, 300 mm, etc.) substrates, and within reasonable growth times, require design and fabrication of novel apparatus that can allow uniform application of a wide range of temperatures and pressures over the entire surface area of the semiconductor wafer or any other substrate forming the diffusion-couple. A core component of such an apparatus is a reactor that is not only capable of hosting such large area substrates but also allow a chemically purged environment, heated large-area substrates with near-zero temperature non-uniformity, as well as facile mechanisms to apply relatively large and uniform mechanical pressures (e.g., up to 1000 psi, etc.) to the diffusion-couple. It is noted that in some examples, atmospheric pressure can be utilized.

An imminent need for such a large-area diffusion-couple is in the emerging field of atomically-thin two-dimensional (2D) materials, particularly graphene or multi-layered-graphene (MLG) (essentially a single or multiple atomic layers of carbon atoms arranged in a hexagonal lattice), that must be directly synthesized over a desired substrate (typically a dielectric or a metal) without the need for a transfer-step that is considered unfeasible and cost-ineffective in the mainstream electronics (or CMOS) industry. Such graphene/MLG layers are preferred materials in several back-end-of-line or BEOL (refers to process steps in chip manufacturing after the formation of the active devices such as transistors and diodes) applications, particularly on-chip interconnects. However, BEOL interconnects must be synthesized under a strict thermal budget of <500° C. to avoid any damage to the underlying active devices (e.g. transistors, diodes, etc. via increased diffusion of impurities).

Recent advances in graphene/MLG synthesis at BEOL-compatible temperatures have brought to the forefront the utility of the diffusion-couple for graphene/MLG growth, where a layer of carbon-source (e.g. in the form of powder, slurry, or amorphous-carbon film) deposited over a sacrificial metallic film (such as Nickel) lying over a SiO2/Si substrate forms the diffusion-couple. Application of appropriate mechanical pressure (65-80 psi) on the carbon source at a relatively low temperature (<450° C.) has been shown to be sufficient to allow high-quality graphene/MLG growth, albeit over relatively small (1-2 inches) substrates. Hence, to allow this technique to be integrated in the mainstream CMOS technology, a scaled up (200/300 mm) diffusion-couple apparatus needs to be designed and fabricated. This technique/apparatus is also extendable to a wide range of substrates of different geometries and configurations and to other applications that inherently require a low thermal budget (<500° C.).

SUMMARY OF THE INVENTION

In one aspect, a highly scalable diffusion-couple apparatus includes a transfer chamber configured to load a wafer into a process chamber (e.g., a reactor). The process chamber is configured to receive the wafer substrate from the transfer chamber. The process chamber comprises a chamber for growth of a diffusion material on any target substrate (e.g., such as a silicon wafer). A heatable bottom plate or disk includes a first heating mechanism. The heatable bottom disk is fixed and heatable to a specified temperature. The wafer is placed on the heatable bottom disk. A heatable top disk comprising a second heating mechanism. The heatable top disk is configured to move up and down along an x axis and an x prime axis to apply a mechanical pressure to the wafer on the heatable bottom disk. While the heatable top disk applies the mechanical pressure to the diffusion couple, while the chamber pressure is maintained at a specified low value. The first heating mechanism and the second heating mechanism can be independently tuned to any value in the working range (e.g., from room temperature to 500° C.).

In another aspect, a method for migration (e.g., diffusion) of a deposition material across a diffusion couple deposited on a substrate to the substrate surface includes using a reactor system to facilitate the migration of one or more diffusion materials across a diffusion couple to a substrate by applying a specified pressure to facilitate the migration of the one or more diffusion materials across the diffusion couple to the substrate, and applying a temperature to facilitate the migration of the one or more diffusion materials across a diffusion couple to the substrate.

BRIEF DESCRIPTION OF THE DRAWINGS

The present application can be best understood by reference to the following description taken in conjunction with the accompanying figures, in which like parts may be referred to by like numerals.

FIG. 4 illustrates an example process for migration (e.g., diffusion) of a deposition material across a diffusion couple metal deposited on a substrate (e.g., Si wafer) forming a diffusion-couple, to the substrate surface, according to some embodiments.

3

Figure 1:
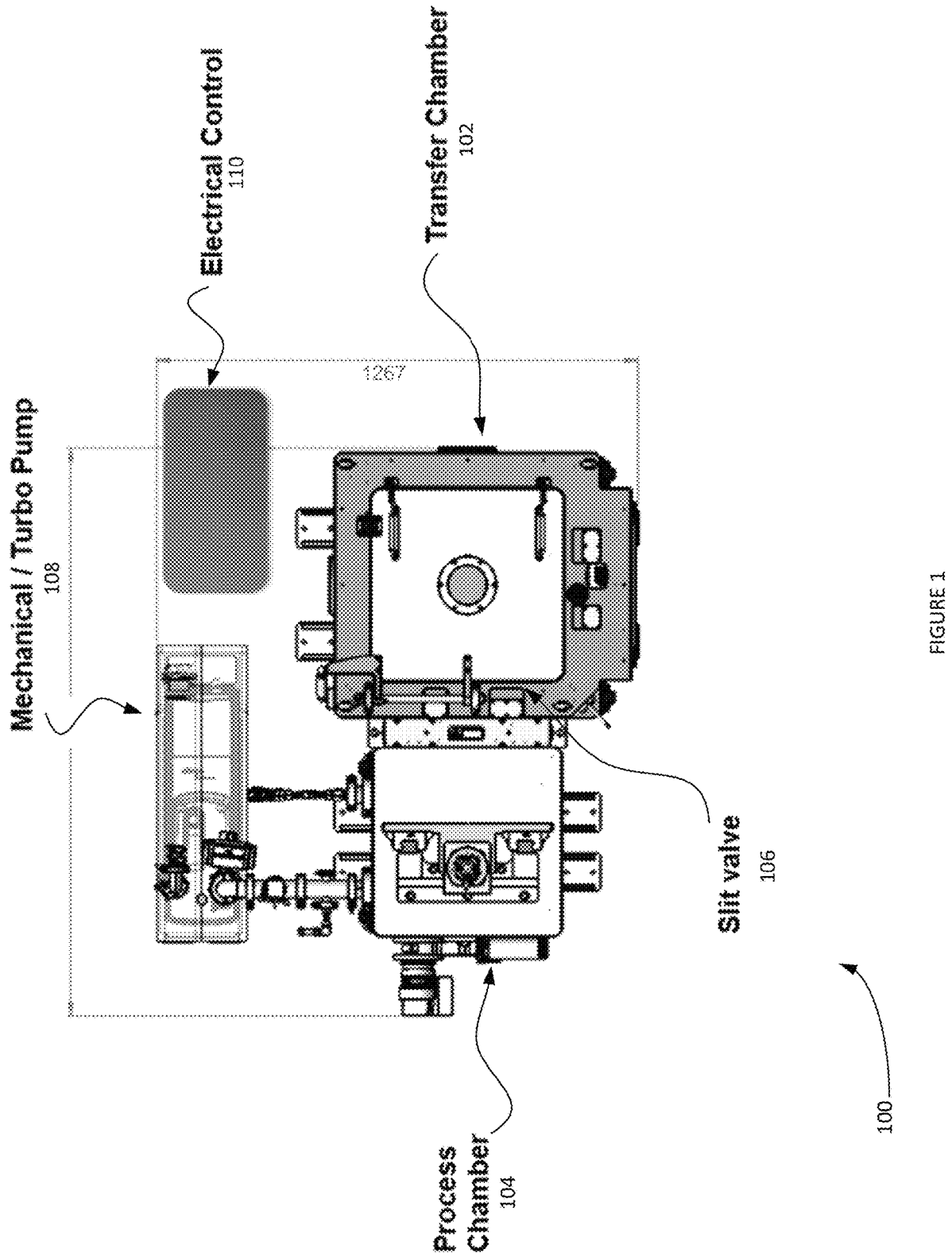
FIG. 1 illustrates an example top-view of the graphene process and transfer chambers of a graphene synthesis tool, according to some embodiments.

FIG. 6 illustrates an example process that uses top and bottom heaters to compress and heat a substrate with uniform pressure and temperature, according to some embodiments.

The Figures described above are a representative set and are not exhaustive with respect to embodying the invention.

DESCRIPTION

Disclosed are a system, method, and article of manufacture for low-temperature/BEOL-compatible highly scalable graphene synthesis tool. The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments.

Reference throughout this specification to "one embodiment," "an embodiment," "one example," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Definitions

Back-End-Of-Line (BEOL) is the second portion of IC fabrication where the interconnects and other elements are formed between and over the individual devices (primarily the transistors) on the wafer (e.g., the metallization layers) separated by intra-layer or inter-layer insulators.

Complementary metal-oxide-semiconductor (CMOS) is a type of metal-oxide-semiconductor field-effect transistor (MOSFET) fabrication process that uses complementary and electrically symmetrical pairs of p-type and n-type MOSFETs for implementing logic functions.

Grain boundary (GB) is the interface between two grains and/or crystallites in a polycrystalline material.

Graphene is an allotrope of carbon consisting of a single layer of atoms arranged in a two-dimensional honeycomb lattice.

Graphene nanoribbons (GNRs) are strips of graphene with width less than one-hundred (100) nm.

Graphite is a layered crystalline form of the element carbon with its atoms arranged and covalently bonded forming a hexagonal structure within the layers.

Piezoelectricity is the electric charge that accumulates in certain solid materials in response to applied mechanical stress.

Resistance temperature detectors (RTDs) are sensors used to measure temperature by monitoring the change in the electrical resistance of a conductor with temperature. RTD elements can consist of a length of fine wire wrapped around a heat-resistant ceramic or glass core but other constructions are also used.

Silicon dioxide is an oxide of silicon and an insulator with the chemical formula $SiO_2$.

Wafer is a thin slice of semiconductor (e.g. a crystalline silicon, germanium) used for the fabrication of integrated circuits, etc.

Example Low-Temperature/BEOL-Compatible Highly Scalable Graphene Synthesis Tool

It is noted that the following example embodiments discuss a graphene source by way of example. However, other carbon-sources (including any carbon carrying compound) can be utilized in other example embodiments.

FIG. 1 illustrates an example top-view of the graphene process and transfer chambers of a carbon-source synthesis tool 100, according to some embodiments. It is noted that in other example embodiments, other diffusion materials (other elements in the periodic table suitable for a specific diffusion metal and application) than carbon-sources can be utilized. Carbon-source synthesis tool 100 can be a low-temperature/BEOL-compatible scalable graphene (and/or other carbon source) synthesis tool. Carbon-source synthesis tool 100 includes transfer chamber 102. Transfer chamber 102 is used to load the wafer. The wafer can be of various sizes (e.g. 300 mm, 200 mm, 150 mm, etc.). An operator/user can place the wafer in transfer chamber 102. The transfer chamber 102 is then closed and sealed. The pressure of the transfer chamber 102 is equalized with the pressure of the process chamber 104. Once the pressure is equalized, the wafer is then pushed to the process chamber 104. It is noted that the wafer can be returned to the transfer chamber 102 after implementation of the deposition and other fabrication methods.

The process chamber 104 and the transfer chamber 102 are connected via a slit valve 108. Slit valve 108 automatically opens once the pressures inside the two chambers are equalized.

The process chamber 104 is the main chamber (or reactor) for growth of graphene (and/or other carbon material) on the wafer. A slightly larger than 300 mm sized substrate is located in the process chamber 104 (e.g. see heated bottom substrate 208). Process chamber 104 is equipped with a heater system. A heated top plate or disk is located in the process chamber 104 as well (e.g. see heated top substrate 206). The heated top disk has its own heating mechanism as well (e.g. see heating power supply 202). In this way, both the lower disk on which the wafer is placed and the heated top disk can be heated independently. For example, the lower disk can be heated and the top disk can be kept at approximately room temperature (or vice versa). The liner surfaces (covering the disks) can be made of graphite, though other materials such as aluminum nitride, quartz, silicon carbide coated graphite, etc. can be employed. Several such materials are possible—generally speaking materials which permit good heat transfer and distribution of pressure can be considered. Flatness and surface finish of the liner can be a key factor to ensure appropriate heat and pressure distribution.

Mechanical/turbo pump 108 can be used to control pressure in process chamber 104 and/or transfer chamber 102. Mechanical pump(s) can be used to lower pressure in process chamber 104 (e.g. $10^{-3}$ torr). The turbo pump can be a more powerful pump that is used to lower the pressure even further (e.g. $10^{-7}$ torr). Low pressure is desired to purge the chamber of any impurities during the operation of the diffusion-couple.

Electrical control 110 can be used to operate carbon-source synthesis tool 100. Electrical control 110 can include computer processor(s) and software systems. Users can input commands, view status of various operations of carbon-source synthesis tool 100, etc.

Figure 2:
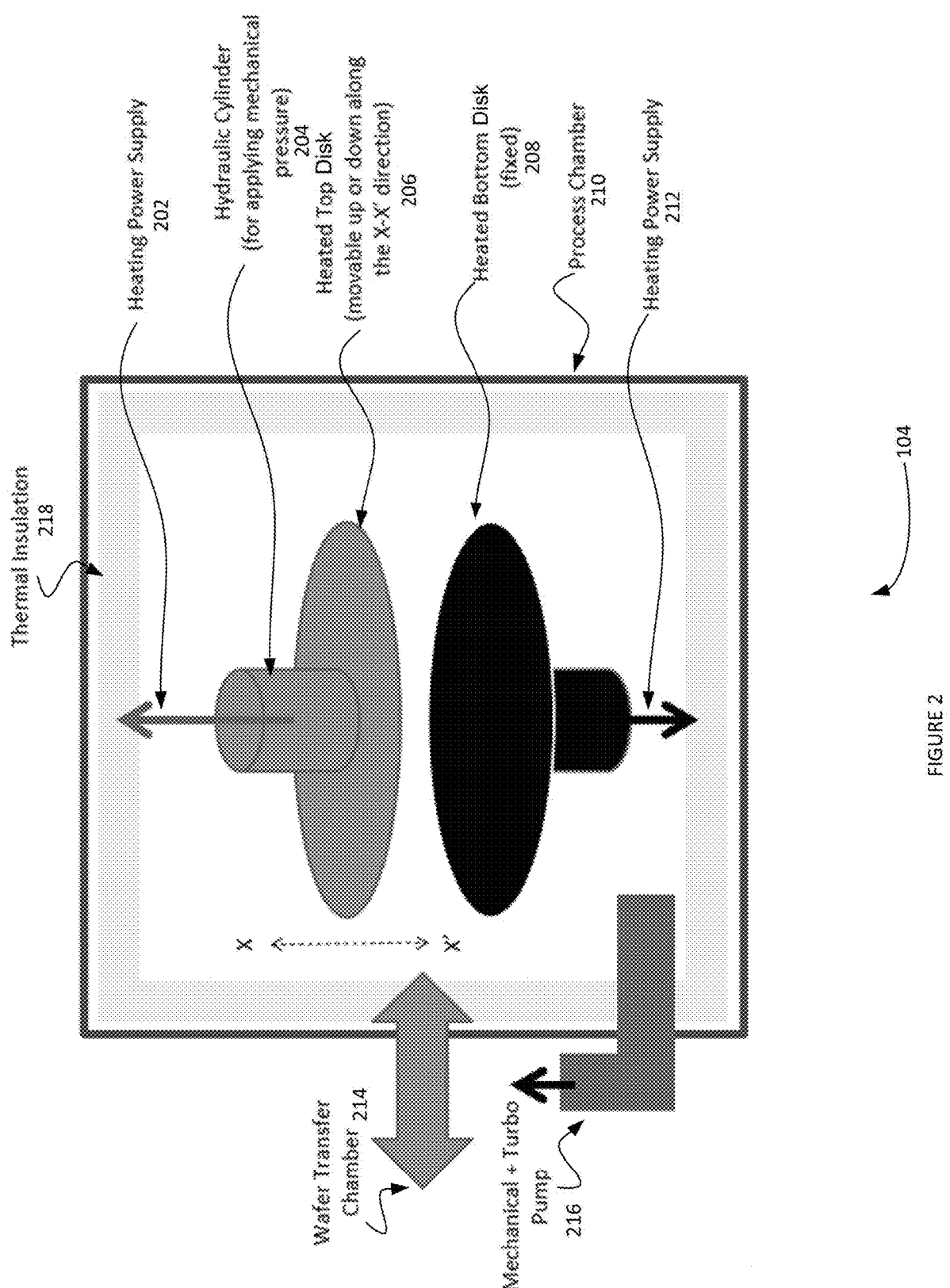
FIG. 2 illustrates an example schematic view of the internal elements of the process chamber, according to some embodiments.

FIG. 2 illustrates an example schematic view of the internal elements of process chamber 104, according to some embodiments. Wafer transfer chamber 214 provided shows transfer of the wafer back and forth to transfer chamber 102 from process chamber 104. Heated bottom disk 208 can be fixed and can be heated to a specified temperature (e.g. 500° C., etc.). Heat power supply 220 can maintain heat on the heat bottom disk 208. This can be done with a ±3° C. uniformity (and/or near-zero non-uniformity) across the heat bottom disk 208. Heated top disk 206 can move up and down along an x and x prime axis. Heat top disk 206 has an independent heating supply (e.g. heat power supply 202). Heated top disk 206 can be operated with hydraulic cylinder 204, a motor, and the like. Heated top disk 206 can be moved to provide mechanical pressure. By way of example, this pressure can be 50 to 125 psi. The wafer is inserted on top of heated bottom disk 208. While the heated top disk 206 applies mechanical pressure to the diffusion-couple while the chamber pressure is maintained at a low value. This pressure can be for example, $10^{-6}$ to $10^{-7}$ torr to prevent contamination of the growth process. Chamber pressure can be regulated by mechanical/turbo pump 216.

An example operation of process chamber 104 is now discussed. Process chamber 104 can be used to deposit/grow a number of layers (e.g. monolayer or few-layer graphene structures, or multi-layer graphene structures). To grow graphene, a graphene source is deposited on a thin film of nickel (e.g., 100 nm in thickness). The graphene source (and/or other carbon-source) can be, inter alia: a graphite powder, a liquid/slurry form as a solvent with graphite, a layer of amorphous carbon deposited on nickel. Different deposition methods and tools can be utilized to deposit the thin film of nickel followed by the carbon source deposition on top of the nickel. The applied mechanical pressure breaks up the graphite source into carbon atoms, which then diffuse through the nickel and then recombine on the other side of the nickel film on top of the target substrate (such as a dielectric layer on a Si wafer). Once the formation of the desired number of graphene layers is completed, the nickel film and the carbon source are then removed.

Figure 3:
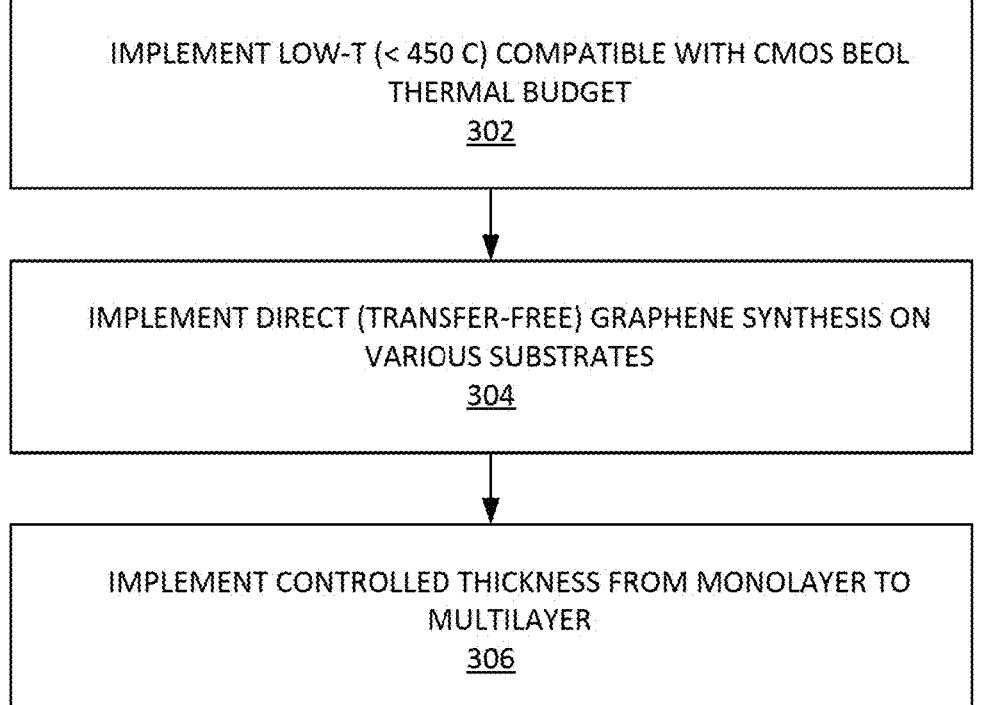
FIG. 3 illustrates an example graphene synthesis tool process, according to some embodiments.

FIG. 3 illustrates an example graphene synthesis tool process 300, according to some embodiments. Graphene synthesis tool process 300 can be used to operate carbon-source synthesis tool 100. Graphene synthesis tool process 300 can grow graphene at relatively low temperatures (e.g. 300-450° C., etc.). It is noted that when process chamber 104 is below ~450° C. then it can be compatible with a CMOS/BEOL thermal budget. BEOL are process steps that take place after front-end-of-line transistors are fabricated. Once a fabrication process has built the transistors on the wafer, the subsequent processing steps should be within the ~450° C. thermal budget to avoid damage to the transistors and various junctions that may lead to shorts and reliability issues.

Graphene synthesis tool process 300 synthesize graphene while the number of layers can be controlled by adjusting process parameters. Graphene synthesis tool process 300 can directly grow on top of any substrate (e.g. dielectric/Si substrate, metallic substrate, etc.). Graphene synthesis tool process 300 can synthesize graphene to thin/few layer coating of a metallic substrate.

More specifically, in step 302, graphene synthesis tool process 300 can implement low-temperature (e.g. <450° C.) graphene films compatible with a CMOS/BEOL thermal budget. In step 304, graphene synthesis tool process 300 can implement a direct (e.g. transfer-free) graphene synthesis on various substrates. In step 306, graphene synthesis tool process 300 can implement controlled thickness from monolayer to multilayer.

EXAMPLE EMBODIMENTS

An example embodiment can start with a wafer (e.g. $Si/SiO_2$), then deposit a thin film of a catalyst metal thin-film such as nickel. The morphology of the catalyst film can be tuned during the deposition or after deposition (e.g., via annealing etc.) to meet specific application needs. Then deposit a uniform distribution of carbon-source on top of Ni. A pressure of 65 to 85 psi is applied on the carbon-source. A disc with a diameter slightly larger than the 300 mm wafer can be used. The substrate (wafer) can be heated to 300° C. to 450° C. Once the pressure is applied, a portion of the carbon items diffuse through the Ni film. The carbon-source/$Ni/SiO_2/Si$ can act as a diffusion-couple. The carbon atoms can recombine on the other side of the Ni (e.g., facing the $SiO_2$) to form a monolayer, few-layer, or multilayer graphene.

Various processing steps can then be implemented (e.g., removing remaining graphite, removing catalyst (Ni) layer, etc.).

Instead of an $SiO_2$, the substrate can be copper or another metal (such as cobalt, ruthenium, molybdenum, tungsten, or an alloy metal, etc.), or a low dielectric constant (low-k) material such as porous silicon-dioxide or hydrogen silsesquioxane (HSQ), etc., or even any patterned substrate formed with metals and dielectrics, etc. In this embodiment, the modification can include a sacrificial layer of amorphous carbon between the Ni and the Cu. In this way, the Ni and the Cu can be prevented from forming an alloy. In other examples, other metals can include, inter alia: Co, Ni, Ru (as both a substrate and/or a catalyst), molybdenum, etc., or a metal compound.

The thicknesses of the substrates and catalysts can be set (e.g. 100 nm, etc.). The number of layer(s) of graphene (i.e., its thickness) required can be a function of thickness of Ni along with other process parameters including time, temperature, pressure, and grain-size of the catalyst film.

The substrate wafer can be 300 mm or 200 mm or smaller/larger (450 mm). A temperature controller can be used to maintain the temperature anywhere from room temperature (~25° C.) to 500° C., or higher as long as process compatibility is met. The graphite powder can be spread in a uniform or pre-patterned manner. A chuck (disk) can be used to press down on the uniformly distributed graphite. Other carbon-containing compounds can also be used as a substitute.

Pressure on the substrate forming the diffusion-couple can be applied by means of mechanical force for instance by employing an instrument such as a chuck, or via any non-contact means such as increasing the substrate environment pressure by, for instance, using a gas pressure (1 bar to several 1000's of bars). A single substrate or multiple substrates as batches can be processed at once. In addition, the gas can be normal air or a specific gas such as Ar, N2 or a mixture of many such gases etc.

Application of heat can be from any source capable of generating a temperature on the substrate. In some embodiments, both the top disk and/or the bottom disk can be heatable. In some embodiments, the top substrate disk and/or the bottom substrate disk may not be heatable, and there can be another heat source such as, for example, the pressure chamber walls, etc.

Example Systems and Methods for Migration of a Deposition Material Across a Diffusion Couple Deposited on a Substrate to a Substrate Surface Example systems and methods can provide for the migration of a deposition material across a diffusion couple deposited on a substrate to the substrate surface. This approach provides many advantages for the deposition of the material.

FIG. 4 illustrates an example process 400 for migration of a deposition material across a diffusion couple deposited on a substrate to a substrate surface, according to some embodiments. Process 400 can use a reactor system to facilitate the migration of one or more diffusion materials across a diffusion couple to a substrate by implementing the following steps. In step 402, process 400 can apply a specified pressure to facilitate the migration of the one or more diffusion materials across the diffusion couple to the substrate. In step 404, process 400 can apply a temperature to facilitate the migration of the one or more diffusion materials across a diffusion couple to the substrate.

Figure 5:
FIG. 5 illustrates another example process for the migration of a deposition material across a diffusion couple metal deposited on a substrate to the substrate surface, according to some embodiments.

FIG. 5 illustrates another example process 500 for or migration of a deposition material across a diffusion couple deposited on a substrate to a substrate surface, according to some embodiments. Process 500 provides the ability to deposit a material that it may not be possible to deposit directly using conventional methods. For example graphene is not known to be directly synthesized on silicon. Process 500 permits this to be realized. It is noted that the grain and other material structures of the deposited material may be tailored by appropriately varying the structure of the diffusion couple and/or process conditions.

In step 502, process 500 deposits the diffusion couple on the substrate by various means, including the most commonly used ones and then depositing some form of the material to be deposited on the substrate on top of the diffusion couple. This may herein be referred to as the prepared substrate or the layer substrate.

In step 504, process 500 places the prepared substrate into an environment of high pressure and high temperature, ranges of which are specified in this document, for a period of time.

In step 506, process 500 can perform the application of heat is accomplished through, inter alia: resistive heating, radiative heating, gas heating and the like.

In step 508, process 500 can apply pressure as well. This can be implemented through, inter alia: mechanical means, through gas pressure, through flexible membranes, through liquid pressure, and the like.

Example Use Case: Reactor with Mechanical Application of Pressure and Direct Heating FIG. 6 illustrates an example process 600 that uses top and bottom heaters to compress a substrate with uniform pressure and temperature, according to some embodiments. Carbon-source synthesis tool 100 can be modified and/or otherwise used to implement the present example embodiment. The substrate is placed on a pedestal (e.g. disk) through means of a handler typical to the equipment industry. The pedestal has the ability to heat the substrate through direct contact. Note that the contact materials may be varied through use of appropriate liner materials. A top moving heater (embedded in a disk) then moves down and puts the substrate under pressure while at the same time heating it. When the process is completed, the substrate is returned out from the reactor (e.g. the process chamber of FIG. 2 supra, etc.).

In step 602, the application surfaces of the top and bottom heater are parallel to the substrate, and sufficiently compliant so as to not damage the substrate. This is accomplished by providing sufficient clearance and play and compliance to the top heater mechanism, as well as by providing a layer of compliance if needed to the application surfaces in step 604.

In step 606, the reactor may also be provided with the means to put the substrate under vacuum and expose it to other gases such as, inter alia, N2, Ar, He, and the like to optimize the process. Hence the reactor may be equipped with vacuum pumps as well as gas lines and a gas panel to ensure ability to put the substrate under various environments.

In step 608, the reactor may be interfaced to equipment that can deliver the substrates to and from the reactor. For example in the case of wafer processing the reactor may be attached to the facet of a transfer chamber that is equipped with a wafer handling robot that operates under high vacuum. In some examples, a slit valve can be provided to isolate the reactor from the rest of the system. A plurality of reactors may be attached to the transfer chamber to facilitate higher throughputs or production rates. There can also be reactors that deposit the diffusion couple including the source material attached to the transfer chamber, such as sputtering and CVD chambers, thereby permitting the creation of the layers on the substrate as well as the deposition of the final material on the same system.

In step 610, process 600 provides in situ sensors (e.g., in the reactor, etc.) to ensure that the pressure and temperature distributions in turn result in optimal migration of the deposition material across the diffusion couple. For example the pressure can be calibrated and monitored through the use of a pressure sensor on the step of the pedestal, through monitoring of the current drawn by the motor applying the pressure between the surfaces, through use of flexures configured as strain gauges embedded in the liner material and the like. Likewise the temperature can be monitored using thermocouples and RTDs mounted in the pedestals, use of IR sensors, phosphorus-based sensors, and the like.

In step 612, process 600 provides software controls to ensure appropriate application of the process parameters in the right sequence and duration.

Other configurations of the reactor that apply other forms of heat and pressure on the substrate are now discussed. It is noted that the aforementioned configuration is just one of many. Alternate configurations could include, inter alia:

Heated membraned subject to high pressure (either pneumatic or hydraulic for example);

Clamshell configurations with high temperature and high pressure heated N2, Ar, other such gases;

Large batch reactors with the same characteristics as discussed supra;

Clamshell in which combinations of the previously detailed approaches to heating and applying pressure to the substrates may be used. For example, high temperature and pressure gas could be fed in; high pressure could be fed in with the bottom heater being used to heat the substrate, bottom heater heats high temperature gas to accomplish the pressure function and maintain temperature, and so on;

Quartz body with substrate placed on a susceptor and inductively heated and pressure loading accomplished using high pressure gas; and May also include an array of lamps in a quartz body for final temp control.

By way of example, the reactors outlined above facilitate the deposition of materials through diffusion couples, as in the use of deposition of graphene onto a silicon wafer across a nickel layer. The deposition method using diffusion couples can be applied to a wider range of deposition materials and diffusion materials.

The following sections provide certain ranges of operation for the system, as well as parameter ranges for desired material structures, composition, and the like for optimal process results.

As noted earlier the use of this method to permit migration of one material across a diffusion couple permits deposition of a material on substrate where it may previously not have been possible through other traditional deposition methods (e.g., graphene is difficult to grow directly on Si or SiO2). The systems described here facilitate the growth of graphene on Si/SiO2 by application of pressure and temperature on the carbon source deposited on a Ni layer that is in turn deposited on the Si wafer, etc.).

It is noted that the reactor can be implemented as a batch reactor and/or single substrate (wafer) reactor. It is noted that in single substrate configurations finer substrate to substrate process control than with a batch reactor can be accomplished. A method of creating a batch process with a single wafer architecture can also be realized by employing a stack of wafers between the two heaters.

CONCLUSION

Although the present embodiments have been described with reference to specific example embodiments, various modifications and changes can be made to these embodiments without departing from the broader spirit and scope of the various embodiments. Accordingly, the specification and drawings are to be regarded in an illustrative rather than a restrictive sense.

What is claimed is:

1. A method for migration of a deposited one or more diffusion materials across a diffusion couple deposited on a substrate to a substrate surface comprising:

using a reactor system to facilitate the migration of the one or more diffusion materials across the diffusion couple to the substrate surface by:

applying a specified pressure to facilitate the migration of the one or more diffusion materials across the diffusion couple to the substrate surface, and applying a temperature to facilitate the migration of the one or more diffusion materials across the diffusion couple to the substrate surface, the specified pressure being a mechanical pressure greater than 30 psi and less than 1000 psi.

2. The method of claim 1, the reactor system using a mechanical means to apply the pressure to facilitate the migration of the one or more diffusion materials across the diffusion couple to the substrate surface, and the mechanical means comprising a pneumatic mechanical means, a hydraulic mechanical means, or a piezoelectric array.

3. The method of claim 1, the reactor system using a flexible pressurized membrane to apply the pressure to facilitate the migration of the materials across a diffusion couple to the substrate surface.

4. The method of claim 1, the operation of applying a temperature to facilitate the migration of the one or more diffusion materials across a diffusion couple to the substrate surface comprises:

using a resistive heating through a direct contact or an indirect contact to apply the temperature to facilitate the migration of the one or more diffusion materials across the diffusion couple to the substrate surface, the temperature being greater than 50° C. and less than 500° C.

5. The method of claim 1, applying a temperature to facilitate the migration of the one or more diffusion materials across a diffusion couple to the substrate surface comprises:

using a heated gas to apply the temperature to facilitate the migration of the one or more diffusion materials across the diffusion couple to the substrate surface, the temperature being greater than 50° C. and less than 500° C.

6. The method of claim 1, applying a temperature to facilitate the migration of the one or more diffusion materials across a diffusion couple to the substrate surface comprises:

using a radiative heating to apply the temperature to facilitate the migration of the one or more diffusion materials across the diffusion couple to the substrate surface, the temperature being greater than 50° C. and less than 500° C.

7. The method of claim 1, further comprising:

using a plurality of reactor configurations capable of processing multiple substrates for batch processing of the substrates.

8. The method of claim 1, the diffusion material comprising carbon.

9. A method for migration of a deposited one or more diffusion materials across a diffusion couple deposited on a substrate to a substrate surface comprising:

using a reactor system to facilitate the migration of the one or more diffusion materials across the diffusion couple to the substrate surface by:

applying a specified pressure to facilitate the migration of the one or more diffusion materials across the diffusion couple to the substrate surface, and applying a temperature to facilitate the migration of the one or more diffusion materials across the diffusion couple to the substrate surface, the temperature being greater than 50° C. and less than 500° C.

10. The method of claim 9, the reactor system using a mechanical means to apply the pressure to facilitate the migration of the one or more diffusion materials across the diffusion couple to the substrate surface, and the mechanical means comprising a pneumatic mechanical means, a hydraulic mechanical means, or a piezoelectric array.

11. The method of claim 9, the reactor system using a flexible pressurized membrane to apply the pressure to facilitate the migration of the materials across a diffusion couple to the substrate surface.

12. The method of claim 9, applying a temperature to facilitate the migration of the one or more diffusion materials across a diffusion couple to the substrate surface comprises:

using a resistive heating through a direct contact or an indirect contact to apply the temperature to facilitate the migration of the one or more diffusion materials across the diffusion couple to the substrate surface, the diffusion material comprising carbon.

13. The method of claim 9, applying a temperature to facilitate the migration of the one or more diffusion materials across a diffusion couple to the substrate surface comprises:

using a heated gas to apply the temperature to facilitate the migration of the one or more diffusion materials across the diffusion couple to the substrate surface, the diffusion material comprising carbon.

14. The method of claim 9, applying a temperature to facilitate the migration of the one or more diffusion materials across a diffusion couple to the substrate surface comprises:

using a radiative heating to apply the temperature to facilitate the migration of the one or more diffusion materials across the diffusion couple to the substrate surface, the diffusion material comprising carbon.

15. The method of claim 9, further comprising:

using a plurality of reactor configurations capable of processing multiple substrates for batch processing of the substrates.

16. A method for migration of a deposited one or more diffusion materials across a diffusion couple deposited on a substrate to a substrate surface comprising:

using a reactor system to facilitate the migration of the one or more diffusion materials across the diffusion couple to the substrate surface by:

applying a specified pressure to facilitate the migration of the one or more diffusion materials across the diffusion couple to the substrate surface, and applying a temperature to facilitate the migration of the one or more diffusion materials across the diffusion couple to the substrate surface, the specified pressure being a mechanical pressure greater than 30 psi and less than 1000 psi, the temperature being greater than 50° C. and less than 500° C., the diffusion material comprising carbon, graphene being formed, and the graphene being disposed at the substrate surface.

17. The method of claim 16, further comprising:

using a plurality of reactor configurations capable of processing multiple substrates for batch processing of the substrates.

18. The method of claim 16, the substrate comprising single-crystal, polycrystalline, or amorphous semiconductor materials comprising Si, or Ge, or Cu, or Ru, or Mo, or W, or SiO2, or porous SiO2, or HSQ (hydrogen silsesquioxane), and a top surface of the substrate, the substrate surface, comprising a dielectric material, or a metal, or both.

19. The method of claim 16, the carbon comprising amorphous carbon.

20. The method of claim 16, applying a temperature to facilitate the migration of the one or more diffusion materials across a diffusion couple to the substrate surface comprises:

using a resistive heating through a direct contact or an indirect contact to apply the temperature to facilitate the migration of the one or more diffusion materials across the diffusion couple to the substrate surface.

* * * * *